(12) United States Patent
Frey (10) Patent No.: US 7,269,254 B2
(45) Date of Patent: Sep. 11, 2007

(54) INTEGRATED DRIVER CIRCUITRY

(75) Inventor: Douglas R. Frey, Bethlehem, PA (US)

(73) Assignee: Silicon Laboratories, Inc., Austin, TX (US)

( * ) Notice: Subject to any disclaimer, the term of this patent is extended or adjusted under 35 U.S.C. 154(b) by 558 days.

(21) Appl. No.: 10/153,173

(22) Filed: May 21, 2002

(65) Prior Publication Data
US 2003/0219111 A1 Nov. 27, 2003

(51) Int. Cl.
*H04M 1/00* (2006.01)
*H04M 9/00* (2006.01)

(52) U.S. Cl. ....................................... 379/401

(58) Field of Classification Search ........... 379/399.01, 379/401, 413; 330/255, 298
See application file for complete search history.

(56) References Cited

U.S. PATENT DOCUMENTS

| | | | |
|---|---|---|---|
| 5,162,753 A | | 11/1992 | Khorramabadi |
| 5,649,009 A | * | 7/1997 | Enriquez et al. ....... 379/399.01 |
| 6,166,603 A | * | 12/2000 | Smith ......................... 330/263 |
| 6,249,410 B1 | * | 6/2001 | Ker et al. ..................... 361/56 |
| 6,275,102 B1 | | 8/2001 | Muza |
| 6,442,255 B1 | * | 8/2002 | Pitsch et al. ........... 379/106.01 |

OTHER PUBLICATIONS

Haideh Khorramabadi, "A CMOS Line Driver with 80 dB Linearity for ISDN Applications", IEEE Journal of Solid State Circuits, vol. 27, No. 4 p. 539-542 (Apr. 1992).
Fan You, et al., "Low Voltage Class AB Buffers with Quiescent Current Control", IEEE Journal of Solid State Circuits, vol. 33, No. 6, p. 915-920 (Jun. 1998).

* cited by examiner

*Primary Examiner*—Curtis A Kuntz
*Assistant Examiner*—Alexander Jamal
(74) *Attorney, Agent, or Firm*—Davis & Associates; William D. Davis (57) ABSTRACT

A linear amplifier architecture includes first, second, and third stages. The first stage is a transconductance stage. The third stage is a current amplification stage. The second stage is an interfacing stage between the first and third stages. The interfacing stage provides a voltage bias and a current to the third stage. The linear amplifier is a class AB amplifier. Quiescent currents for the output devices of the third stage are controlled by the second stage. The stages may be fabricated on the same semiconductor substrate. In one embodiment, the amplifier is fabricated as a complementary metal oxide semiconductor (CMOS) integrated circuit using metal oxide semiconductor field effect transistors (MOSFET). In one application, the amplifier serves as a component of a driver circuit for a subscriber line. Electrostatic discharge (ESD) protection circuitry provided for the amplifier may also be suitable for other applications. In various embodiments, the ESD circuitry enables dynamic clamping of the output devices without introducing undesirable capacitive coupling during normal circuit operation.

17 Claims, 9 Drawing Sheets

FIG. 9

INTEGRATED DRIVER CIRCUITRY

FIELD OF THE INVENTION

This invention relates to the field of amplifier design. In particular, this invention is drawn to an open loop amplifier architecture with a substantially linear transfer characteristic.

BACKGROUND OF THE INVENTION

Typical amplifier architectures use a high gain amplifier with a feedback network so that the overall loop gain is large in the band of frequencies of interest. This high loop gain may lead to significant stability problems at higher frequencies. Otherwise, the amplifier may begin to oscillate as a result of parasitic phase delays, for example.

The high loop gain is reduced at higher frequencies through appropriate roll off circuitry. Reducing the loop gain over too small a range of frequencies may also introduce sufficient phase shift to destabilize the amplifier. The designer must typically compromise between gain and bandwidth in order to have a functional amplifier at the cost of signal distortion.

Although undesirable, the high loop gain requirement is a result of a highly nonlinear open loop transfer characteristic for the amplifier. This nonlinear open loop gain may be attributed to architectural choices made to improve open loop gain or amplifier power efficiency (i.e., rail-to-rail output capability).

Although the amplifier may be designed as a class A amplifier to improve nonlinearities, class A devices consume large amounts of power from the power supplies. Class AB amplifiers provide better power efficiency but are susceptible to crossover distortion. Moreover, class AB amplifiers still suffer the disadvantages of a large nonlinear open loop transfer characteristic.

SUMMARY OF THE INVENTION

A linear amplifier architecture includes first, second, and third stages. The first stage is a transconductance stage. The third stage is a current amplification stage. The second stage is an interfacing stage between the first and third stages. The interfacing stage provides a voltage bias and a current to the third stage. The linear amplifier is a class AB amplifier. Quiescent currents for the output devices of the third stage are controlled by the second stage. The stages may be fabricated on the same semiconductor substrate. In one embodiment, the amplifier is fabricated as a complementary metal oxide semiconductor (CMOS) integrated circuit using metal oxide semiconductor field effect transistors (MOSFET). In one application, the amplifier serves as a component of a driver circuit for a subscriber line.

Electrostatic discharge (ESD) protection circuitry provided for the amplifier may also be suitable for other applications. In various embodiments, the ESD circuitry enables dynamic clamping of the output devices without introducing undesirable capacitive coupling during normal circuit operation.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The amplifier will be described in an application as a subscriber line interface driver. The amplifier design, however, is not inherently limited to any particular application.

The plain old telephone system (POTS) infrastructure includes analog subscriber lines coupling subscriber equipment (e.g., telephone) to a central office. The central office serves as an entry point to the digital public switched telephone network (PSTN). The analog subscriber line and subscriber equipment form a subscriber loop.

Numerous communication protocol standards have developed to enable using the pre-existing analog portions of the plain old telephone system (POTS) infrastructure for carrying digital data. Although the public switched telephone network (PSTN) is digital in nature, the communication along subscriber lines between subscribers and the central office entry point to the PSTN is analog. As a result, modems are used for bidirectional communication of digital data on the analog channel between the subscriber and the central office. Modems convert the communicated information between the digital and analog domains in accordance with the particular communication protocol.

Some communication protocols are designed to rely on the voiceband region of the analog channel to convey information. Digital subscriber lines (xDSL) services can provide significantly higher data transmission rates by utilizing communication bandwidth beyond but excluding the voiceband.

Modems or other devices designed for communicating digital data on the analog channel utilize an analog front end for transmitting as well as receiving information from the subscriber line. The analog front end conditions signals communicated to or from the subscriber line before providing the conditioned signal to the subscriber line for transmission or to a digital signal processor for interpretation. The analog front end includes driver circuitry to provide sufficient signaling power for communication between the central office and the customer premises.

Driver circuitry designed predominately for voiceband communications may introduce significant distortion into the higher range frequencies used for digital subscriber line services. Typically, the driver is designed as a high gain amplifier with a feedback network so that the overall loop gain is large in the frequency band of interest. For digital or analog voiceband communications, this would not present a problem. xDSL communication services, however, utilize frequencies higher than voiceband. At such high frequencies, a voiceband driver circuit may experience significant instability due to the high loop gain. The instability can introduce significant distortion into the digital content of the DSL communication effectively rendering xDSL communication services useless.

Subscriber line driver circuitry for xDSL applications may be formed from high gain amplifiers with feedback. Typically, this implies a large loop gain for the amplifier, at least within the frequency range of interest. This loop gain is problematic for higher frequencies. The amplifier gain must be rolled off early to avoid instabilities.

Figure 1:
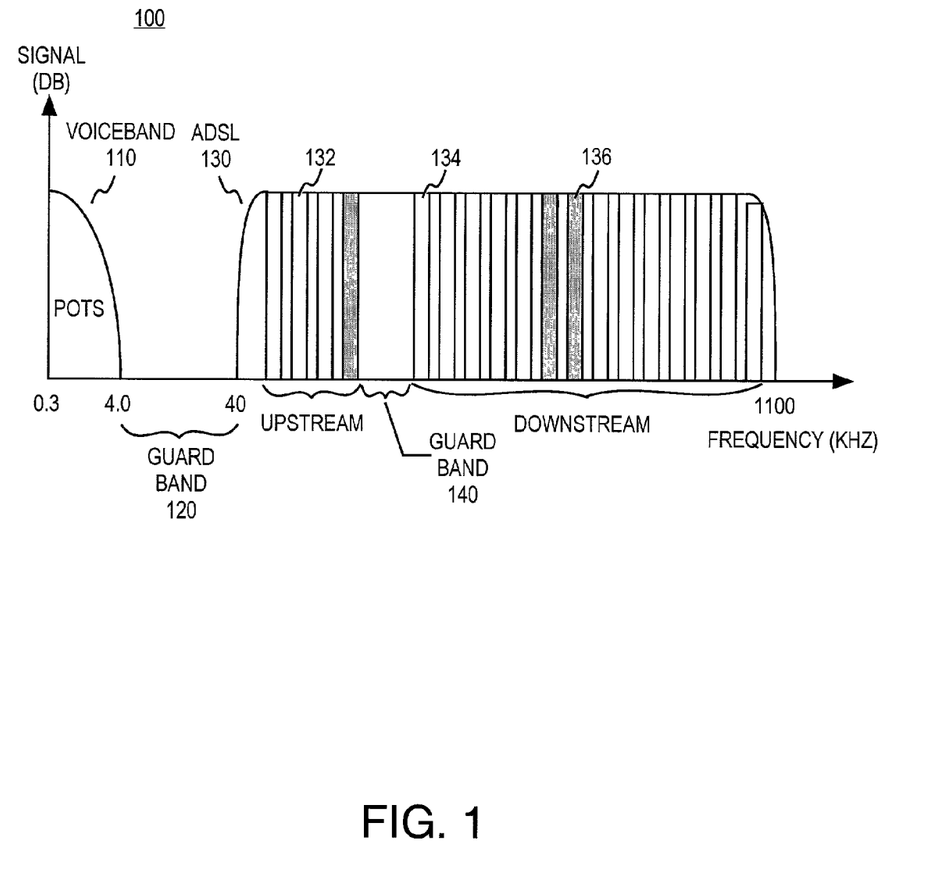
FIG. 1 illustrates the communication spectrum allocated for a subscriber line.

FIG. 1 illustrates the communication spectrum allocation for a subscriber line as set forth in a series of recommendations from the International Telecommunication Union (ITU) for subscriber line data transmission. Chart 100 compares the portions of the analog channel used by voiceband modems (voiceband 110) as well as xDSL modems (ADSL 130). Voiceband communications typically use the voiceband range of 300-4000 Hz. ADSL is in a range of approximately 25-1100 KHz. A guard band 120 separates the voiceband and ADSL ranges.

Asymmetric digital subscriber line (ADSL) communications represent one variant of xDSL communications. Exemplary ADSL specifications are set forth in ITU specifications "Rec. G.992.2 (06/99) Splitterless asymmetric digital subscriber line (ADSL) transceivers" (also referred to as full rate ADSL), and "Rec. G.992.1 (06/99)—Asymmetric digital subscriber line (ADSL) transceivers" (also referred to as G.LITE).

There are multiple line coding variations for xDSL. Carrierless Amplitude Phase (CAP) and Discrete Multi-Tone modulation both use the fundamental techniques of quadrature amplitude modulation (QAM). CAP is a single carrier protocol where the carrier is suppressed before transmission and reconstructed at the receiving end. DMT is a multicarrier protocol. FIG. 1 illustrates DMT line coding.

DMT modulation has been established as a standard line code for ADSL communication. The available ADSL bandwidth is divided into 256 sub-channels. Each sub-channel 134 is associated with a carrier. The carriers (also referred to as tones) are spaced 4.3125 KHz apart. Each sub-channel is modulated using quadrature amplitude modulation (QAM) and can carry 0-15 bits/Hz. The actual number of bits is allocated depending upon line conditions. Thus individual sub-channels may be carrying different numbers of bits/Hz. Some sub-channels 136 might not be used at all. Generally, greater data rates (i.e., more bits/Hz) are assigned to the lower sub-channels because signals are attenuated more at higher frequencies. DMT implementations may also incorporate rate adaption to monitor the line conditions and dynamically change the data rate for sub-channels. ADSL uses some sub-channels 134 for downstream communication and other sub-channels 132 for upstream communication. The upstream and downstream sub-channels may be separated by another guard band 140.

Figure 2:
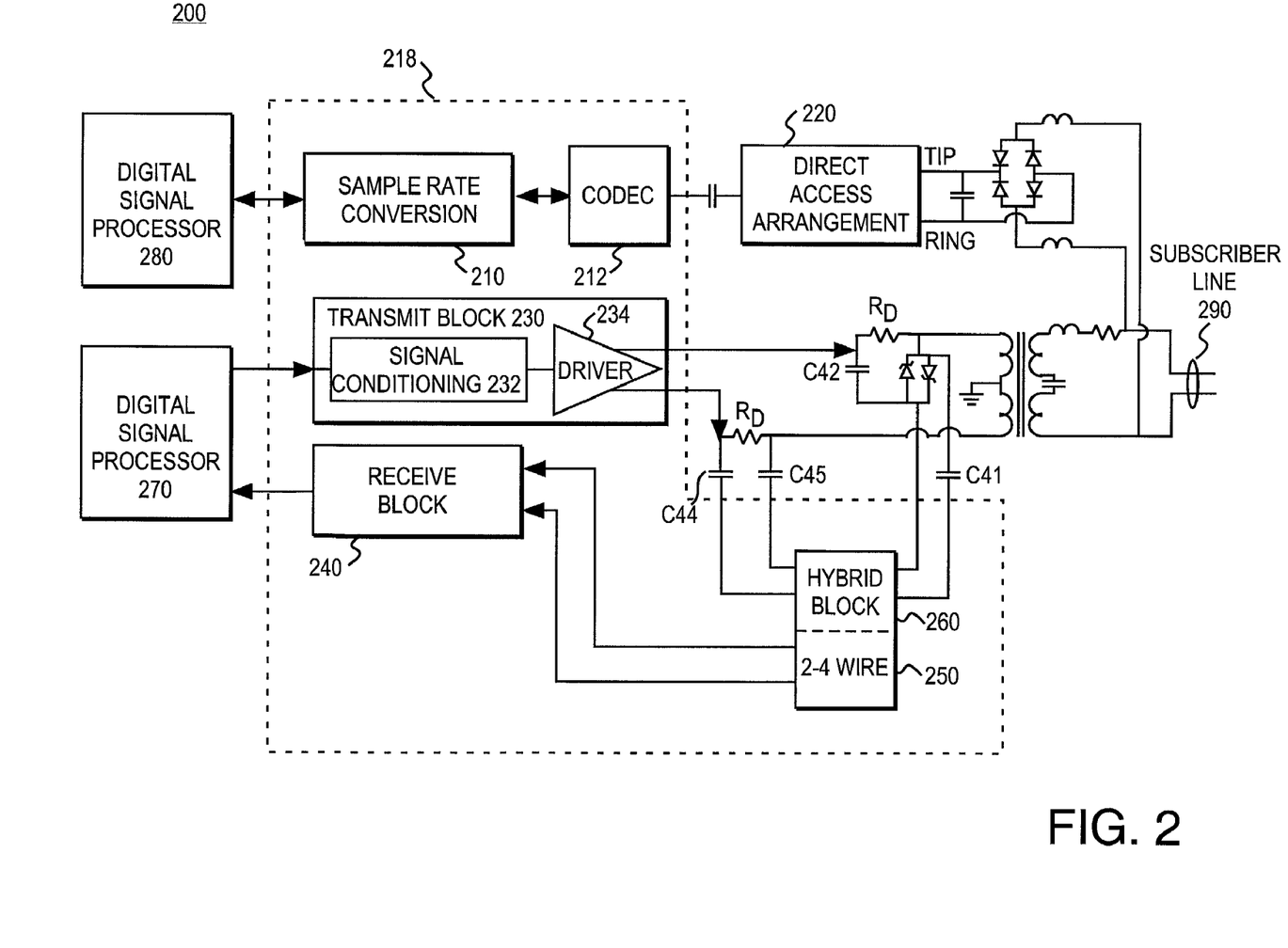
FIG. 2 illustrates an analog front end for communication with a subscriber line including driver circuitry.

FIG. 2 illustrates an analog front end for communicating information on an analog channel carried by a subscriber line between a subscriber and the central office. In one embodiment, the analog front end includes circuitry for handling voiceband as well as non-voiceband (i.e., xDSL) communications. The analog front end conditions signals communicated between the subscriber line 290 and digital signal processors 270, 280.

In one embodiment, the analog front end 218 (including hybrid 260) is provided on a single substrate within an integrated circuit package. Within the integrated circuit, non-voiceband communication (e.g., xDSL) is handled by transmit block 230, receive block 240, 2-4 wire block 250, and hybrid 260. The hybrid and 2-4 wire conversion functions may be combined into a common hybrid network block as illustrated. In one embodiment, the analog front end is implemented as complementary metal oxide semiconductor (CMOS) circuitry within the integrated package. The integrated circuit may further comprise circuitry to support voiceband communications within the same integrated circuit package. For example, sample rate converter 210 and codec 212 may be incorporated onto the same substrate as the xDSL circuitry.

Digital signal processor (DSP) 270 provides information in digital form to the transmit block 230 for communication on the analog channel of the subscriber line. Within transmit block 230, signal conditioning is applied to the information in block 232. The conditioned signal is then provided to driver 234. Driver 234 drives the upstream signal onto the subscriber line 290 through appropriate passive interface circuitry.

Figure 3:
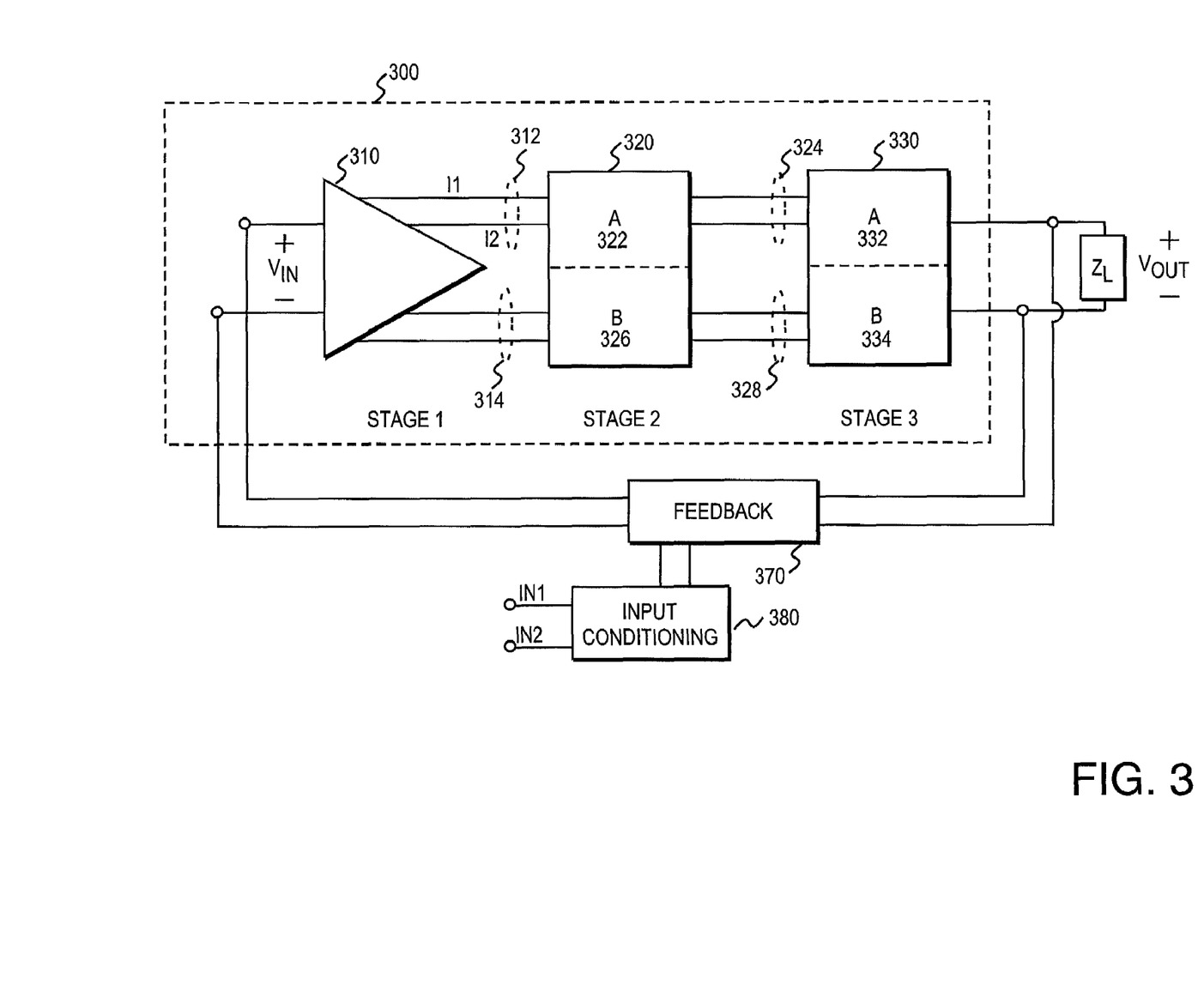
FIG. 3 illustrates one embodiment of an integrated driver circuit.

FIG. 3 illustrates one embodiment of an improved amplifier architecture for driving a load $Z_L$. The discussion focuses predominately on the open loop amplifier circuit 300 rather than feedback circuitry 370, or input conditioning circuitry 380. In practice, however, feedback circuitry 370 provides closed loop control of the amplifier. Input conditioning circuitry 380 performs current or voltage conversion as well as scaling for input signals IN1 and IN2 as necessary.

The amplifier circuit is a 3 stage differential input, differential output amplifier. Stage 1 310 is a transconductance amplifier. Amplifier 310 receives a differential voltage signal $V_{IN}$ as an input signal and produces two pair 312, 314 of differential current signals. Pair 312 and 314 are substantially identical with the exception of a 180° phase shift between the differential signal pairs which may be achieved by swapping I1 and I2 of the second differential pair relative to the first differential pair as provided to stage 2.

Both differential signal pairs are provided to stage 2. Stage 2 320 is partitioned into identical halves—part A 322 and part B 326. Part A receives differential signal pair 312. Part B receives differential signal pair 314. As stated above, the differential signal provided to part B has a 180° phase shift relative to differential signal pair 312 which can be achieved by swapping the corresponding I1 and I2 signal lines.

Stage 3 330 is likewise partitioned into identical halves-part A 332 and part B 334. Stage 3 part A 332 receives differential signal pair 324 from stage 2 part A 322. Similarly, stage 3 part B 334 receives differential signal pair 328 from stage 2 part B 326. Stage 3 provides a differential current signal which produces $V_{OUT}$ across a load $Z_L$. Each part 332 and 334 provides one line of the differential output signal pair.

Figure 4:
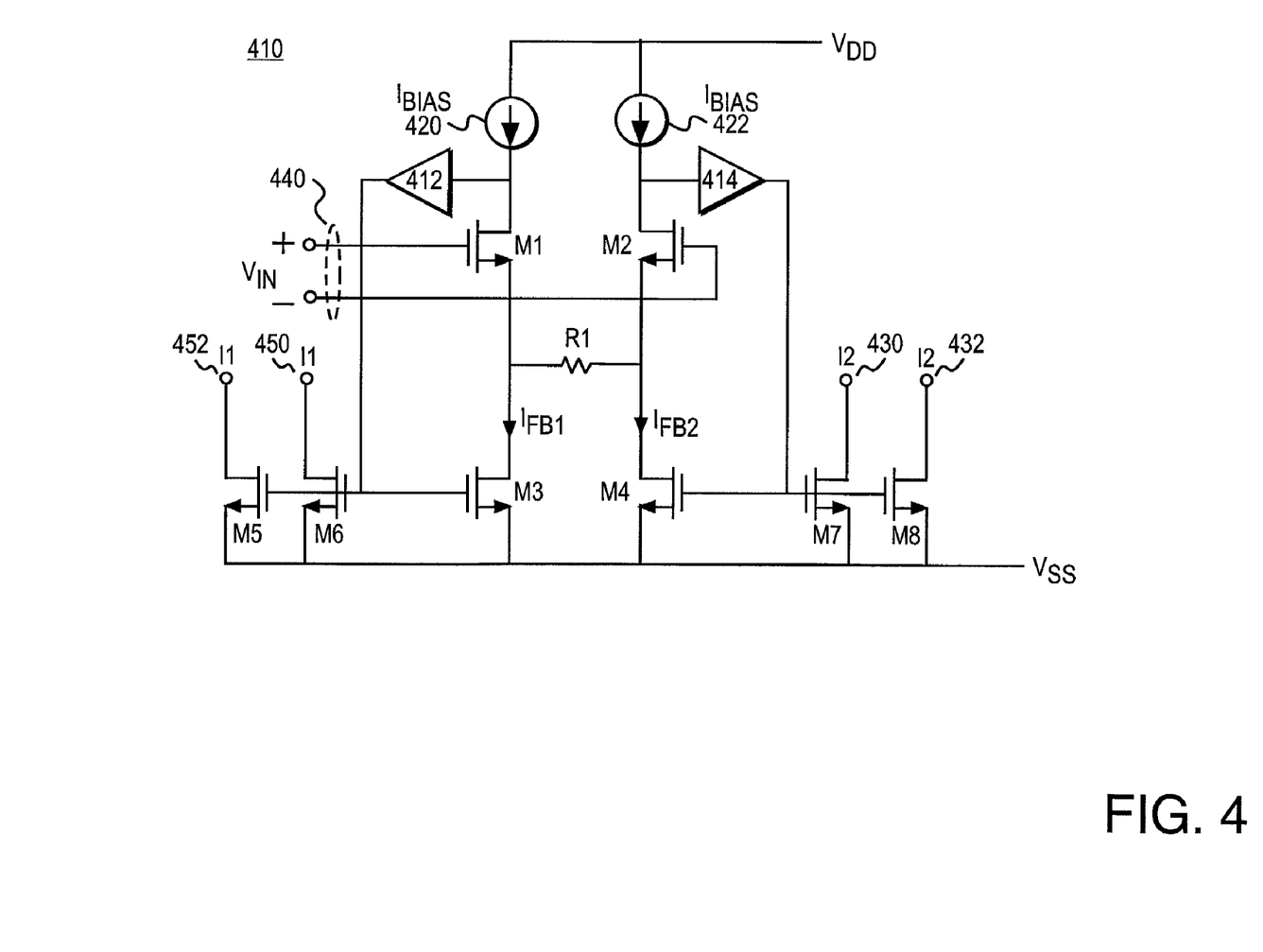
FIG. 4 illustrates one embodiment of the first stage of the driver circuit.

FIG. 4 illustrates the stage 1 transconductance amplifier 310 in greater detail. Transistors M1 and M2 operate at substantially constant drain currents as a result of bias current sources (420,422), buffers (412, 414), and feedback transistors (M3, M4). The buffers may comprise cascode p-channel devices or source followers for appropriate biasing.

Given that M1 and M2 operate at substantially constant drain currents, the voltage across resistor R1 will equal the input differential voltage $V_{IN}$ applied to the gates of transistors M1 and M2 at input differential signal line pair 440. The difference between currents $I_{FB1}$ and $I_{FB2}$ is proportional to the differential input voltage in accordance with the proportionality factor $$\frac{1}{R1}.$$

Transistors M5 and M6 are current mirrors with respect to M3. Similarly, M7 and M8 mirror M4. Assuming M5 and M6 are substantially the same size as M3, the drain currents (I1) through nodes 452 and 450 will be the same as $I_{FB1}$. Similarly, the drain currents (I2) through nodes 430 and 432 will be the same as $I_{FB2}$. The difference of I1 and I2 is $$\frac{1}{R1}$$

times the differential input voltage, $V_{IN}$. The nominal drain current in M1-M4 is $I_{BIAS}$. Due to current mirroring, the nominal current through M5-M8 is also $I_{BIAS}$. The relative areas of transistors M3-M8 may be adjusted to achieve mirrors providing multiples of $I_{FB1}$ and $I_{FB2}$, thus varying the transconductance gain of the first stage.

Stage 2 is provided primarily to interface between stage 1 and stage 3. Thus the design of stage 2 is dependent upon the design of stage 3. Accordingly, the architecture of stage 3 is discussed before the architecture of stage 2. Given that stages 2 and 3 are subdivided into identical halves, the discussion will be drawn to part A of each amplifier stage with the understanding that the same statements apply to part B of each amplifier stage.

Stage 3 is a high gain class AB current amplifier. Although a current mirror can be used to produce large current gains, typical techniques for implementing complex current mirrors create undesirable results for stage 3. For example, cascading transistors is a technique used to improve the accuracy and linearity of a current mirror. Cascoding of devices, however, reduces the compliance range which is undesirable in a rail-to-rail class AB output stage.

A simple current mirror will experience an undesirable nonlinear transfer gain unless the voltage across the terminals of the input device and the output device of the current mirror experience the same drop. A feedback loop may be provided to ensure voltage tracking. Such a feedback structure imposes bandwidth limitations on the current mirror. The bandwidth limitations are exacerbated by the larger geometry of the mirroring output devices relative to the input transistor.

Figure 5:
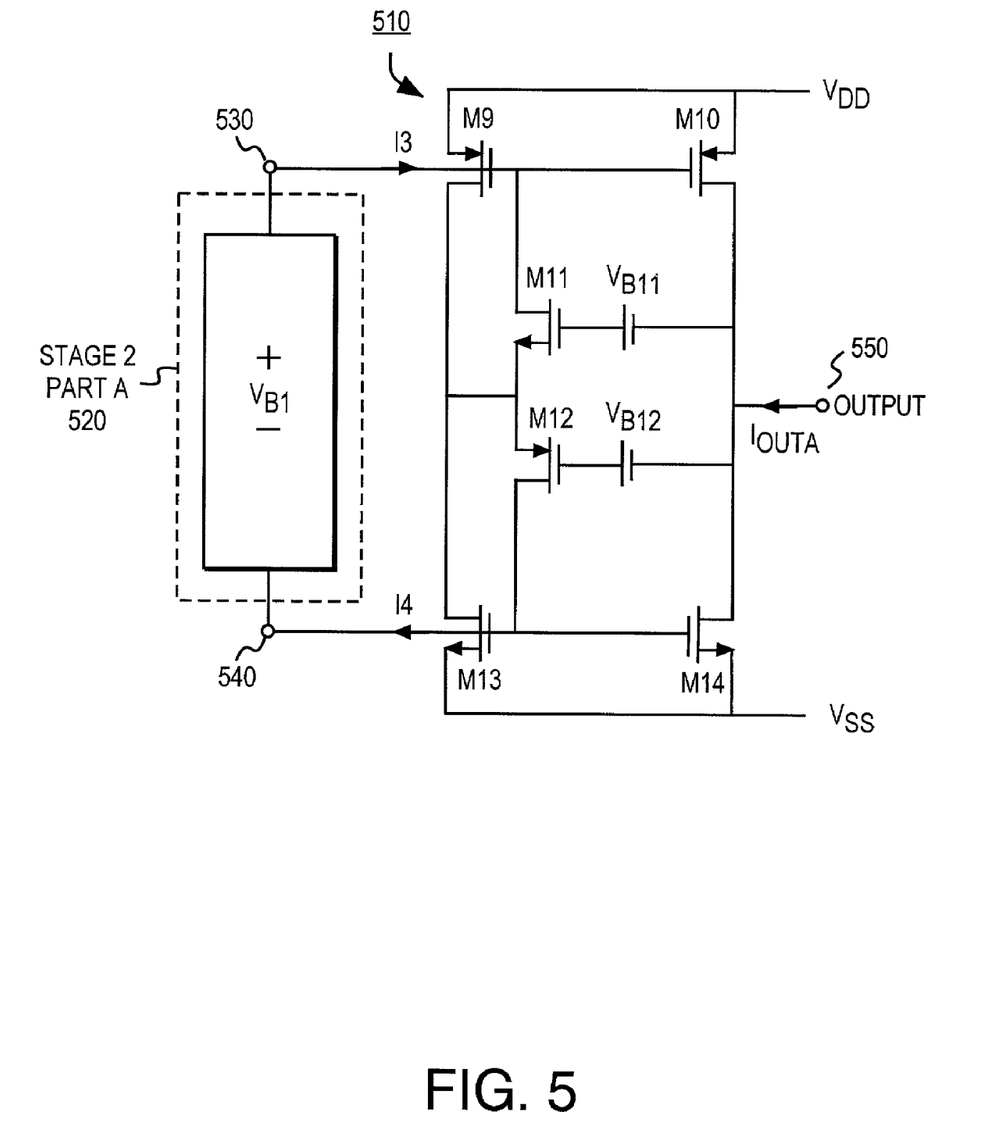
FIG. 5 illustrates one embodiment of the third stage of the driver circuit.

FIG. 5 illustrates one embodiment of stage 3 part A implementing a current amplifier using a pair of current mirrors. One current mirror is formed by devices M9, M10, and M12 with bias $V_{B12}$. The other mirror is formed by devices M13, M14, and M11 with bias $V_{B11}$. Current amplifier 510 effectively provides an output current $I_{OUTA}$ that is a linear function of the net current I3-I4 (i.e., $I_{OUTA}=N(I3-I4)$). The output node of part A and the output node of part B form the differential output signal line pair.

Battery $V_{B12}$ ($V_{B11}$) is set equal to the approximate gate-to-source voltage of M12 (M11). As a result, the drain-to-source voltage of M9 (M13) is substantially the same as the drain-to-source voltage of M10 (M14). This ensures that the drain current of M10 (M14) matches the drain current of M9 (M13), if the devices have the same geometry. In the event M10 (M14) is N times larger than M9 (M13), the drain current of M10 (M14) will be N times larger than that of M9 (M13). In one embodiment, N≈500 for a current gain of 500. In practice, $V_{B11}$ and $V_{B12}$ are implemented with circuitry rather than a battery.

The voltage $V_{B1}$ is presumed to be sufficiently large enough to ensure M12 (M11) is operating in active mode as a cascode for M9 (M13). The use of a cascode device with M9 (M13) does impose a compliance constraint on the input of stage 3, but not on the output 550. Stage 2 520 functions at least in part to provide the appropriate $V_{B1}$ to ensure proper operation of cascoding transistors M11 and M12 while providing an appropriate quiescent bias for output transistors M10 and M14.

With the appropriate biasing, the current mirrors of stage 3 co-operate in a push-pull fashion. Transistors M10 and M14 alternately conduct current on positive and negative signal swings, respectively, at the output of the circuit. If N represents a ratio of size factors between M10 to M9 and M14 to M13, then the output current will be N times the differential input current substantially independent of the output signal swing. Thus amplifier 510 is a substantially linear push-pull (class AB) current mirror with a gain of N between the output and the input. A differential signal pair generated by stage 2 (e.g., 324 or 328) is provided at the input to stage 3 at nodes 530 and 540.

Figure 6:
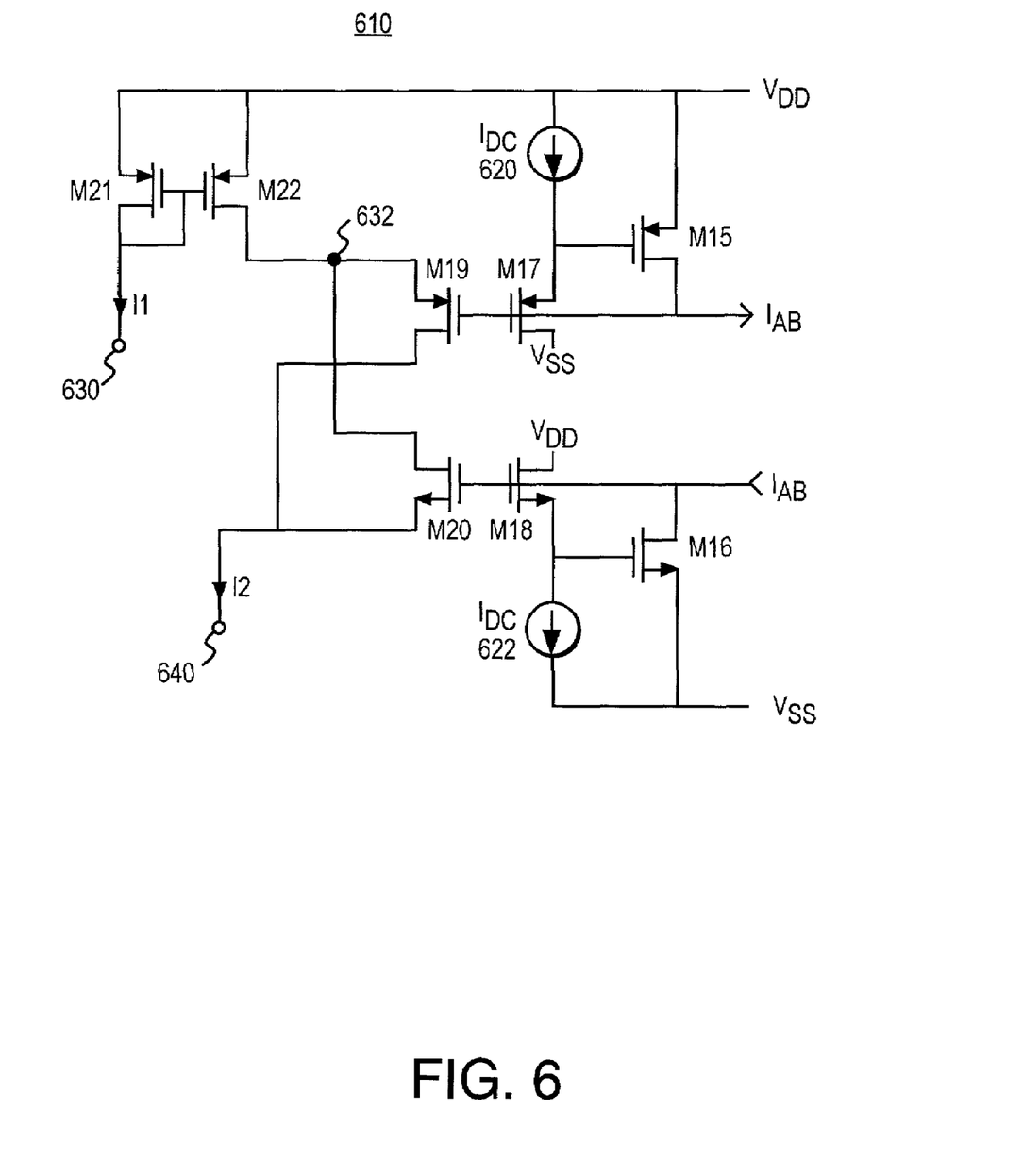
FIG. 6 illustrates one embodiment of the second stage of the driver circuit.

Stage 2 provides the appropriate biasing for stage 3 while interfacing with stage 1. FIG. 6 illustrates stage 2 in greater detail. Nodes 630 and 640 are coupled to receive I1 and I2, respectively from differential output signal line pair 312 of stage 1. Node 632 is coupled to node 530 of stage 3. Node 640 is coupled to node 540 of stage 3. Stage 2 is capable of providing a voltage bias between the input nodes of stage 3 while applying a current input to stage 3.

Transistors M21 and M22 form a current mirror allowing the proper current input to stage 3. Current sources $I_{DC}$ 620 and 622 bias transistors M17 and M18 at the same nominal current level as transistors M19 and M20, respectively. Control currents of value $I_{AB}$ are provided to the drains of transistors M15 and M16. These control currents determine the quiescent current of the output transistors of stage 3.

As a result of the biasing of transistors M17 and M18, the source terminals of M19 and M20 are at the same potential as the gate terminals of M15 and M16, respectively. Given that the source terminals of M17 and M18 are coupled to the gates of output devices M10 and M14 of stage 3, the voltages at the gates of M15 and M16 control the voltages at the gates of M10 and M14. Therefore the quiescent current, $I_Q$, through M10 and M14 is proportional to the control current $I_{AB}$ by a multiple determined by the relative sizes of transistors M15 and M16 to M10 and M14, respectively (i.e., $I_Q=N\cdot I_{AB}$).

For example, if N=500 the quiescent current through M10 and M14 is $500I_{AB}$. Thus the quiescent bias for output transistors M10 and M14 of stage 3 is determined by the $I_{AB}$ control currents of stage 2. The current control is effective as long as the currents through M19 and M20 substantially match the currents through M17 and M18.

Transistors M21 and M22 serve primarily to transfer one component (e.g., I1) of the differential signal pair (I1, I2) from stage 1. The drain current I1, through M21 is mirrored by M22 so that the drain current through M22 is likewise I1.

Consider the case when the differential output signal (I1−I2) of stage 1 is substantially zero such that the output current of stage 3 should be zero. If currents I1 and I2 were equal to $2I_{DC}$, then the current flowing in M19 and M20 were equal to $I_{DC}$ such that the voltages at the sources of M19 and M20 are equal to the voltages at the sources of M17 and M18, respectively. The sources of M19 and M20 are coupled to the input nodes of stage 3. Thus when the currents I1, I2=$2I_{DC}$, the currents in output transistors M10 and M14 will equal a scaled version of $I_{AB}$. This scaled current is the quiescent current of the output devices of stage 3. The quiescent current is preferably chosen to be much smaller than the peak output currents of stage 3. Thus class AB operation of stage 3 is enabled with the biasing interface circuitry of stage 2.

Consider the case when the differential output signal of stage 1 is nonzero as a result of a nonzero differential input signal. When an input signal is applied to stage 1 resulting in a differential output signal such that I1≠I2, then an imbalance will exist between the drain current of M22 and current I2. This imbalance is passed to stage 3 for amplification. Currents I3 and I4 are positive. Due to the nature of class AB amplifiers, only one of I3 or I4 will track the differential signal I1−I2 while the other remains near zero. Referring to stage 1, when I1>I2 then I3>I4 and the current mirror formed by transistors M11, M13, and M14 is active. When I1<I2, then I3<I4 and the current mirror formed by M12, M9, and M10 is active.

The accuracy of the current mirroring circuitry of FIGS. 4 and 6 may be improved with the use of cascode devices as is well known to those skilled in the art. In various embodiments, each amplification stage comprises metal oxide semiconductor field effect transistors (MOSFETs). In alternative embodiments each stage may comprise bipolar junction transistors (BJTs). The stages may be fabricated as integrated circuits. In one embodiment, at least two of the stages reside on the same integrated circuit die within the same integrated circuit package.

Practical implementations require consideration of electrostatic discharge (ESD) events that may damage the output transistors of the third stage. Such an event may occur, for example, due to a static charge buildup on some of the pins of the integrated circuit package. Depending upon the sign of the charge, the electrostatic discharge may degrade or destroy transistor M10 or M14, for example. Transistor M10 may be damaged if the potential at the bond pad coupled to the output node of stage 3 falls significantly below the potential of the bond pad associated with $V_{DD}$. Transistor M14 may be damaged if the potential at the output node rises significantly above the potential of the bond pad associated with $V_{SS}$.

Figure 7:
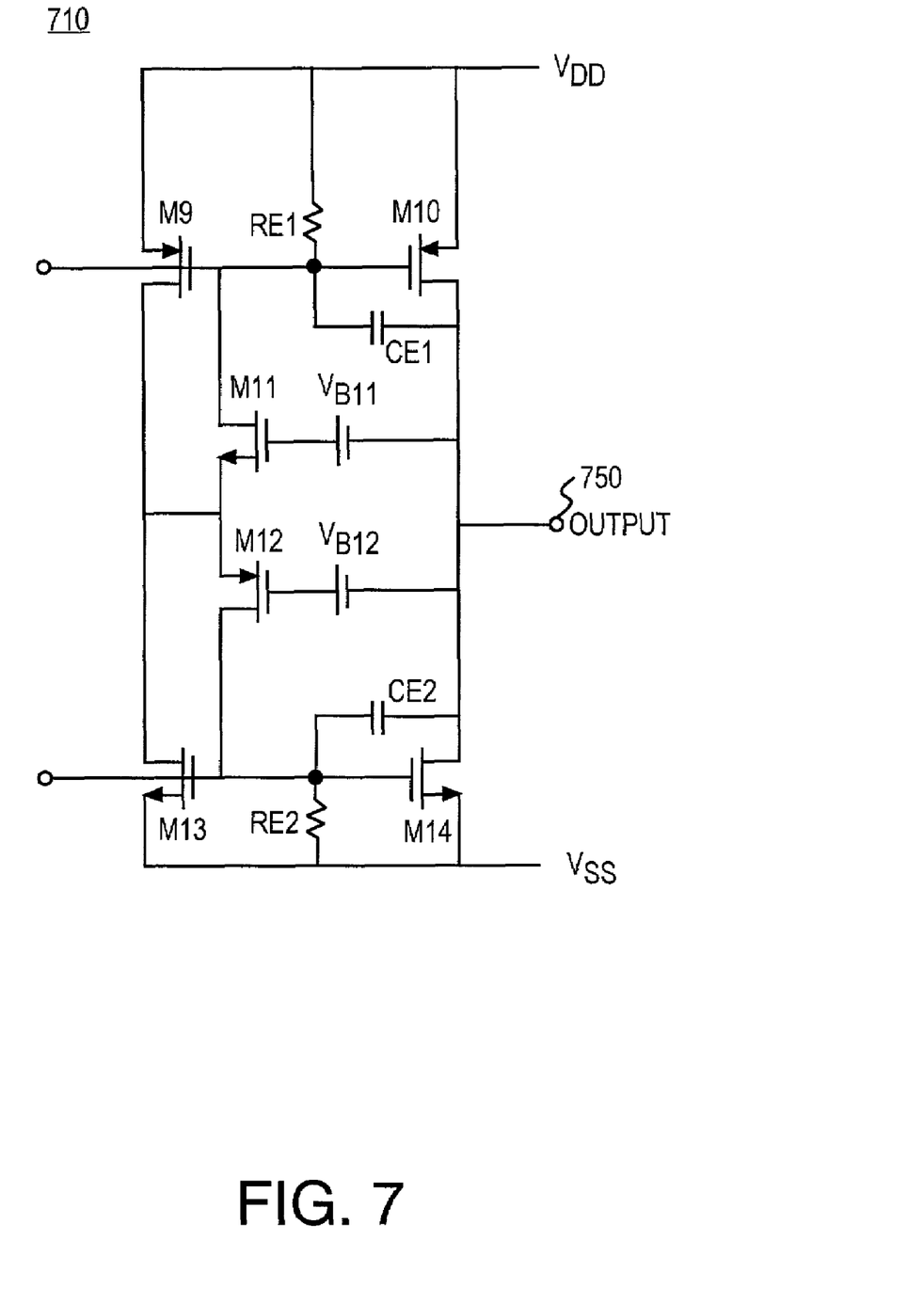
FIG. 7 illustrates one embodiment of ESD protection circuitry.

FIG. 7 illustrates one embodiment of stage 3 710 including ESD circuitry designed to prevent damage to the output transistors. Ideally, the ESD circuitry protects the output transistors without otherwise affecting the performance of the amplifier.

Each output transistor has dynamic clamping ESD circuitry. The gate of transistor M10, for example, is coupled to the $V_{DD}$ bond pad node through resistor RE1 and to the output node 750 bond pad through capacitor CE1. Transistor M14 has similar ESD protective circuitry comprising RE2 and CE2 for coupling the gate of M14 to the output node bond pad and the $V_{SS}$ bond pad node.

If a voltage differential develops between the $V_{DD}$ node and the output node as a result of a rapid buildup of static charge, capacitor CE1 causes the gate of M10 to track the transient thus turning on M10. Due to the large geometry of M10, transistor M10 may successfully quench the ESD event. Similar statements apply to the operation of the ESD circuitry associated with M14. Appropriate sizing of RE1, RE2, CE1, and CE2 to accomplish the dynamic clamping, however, will compromise the performance of the amplifier during normal operation.

Figure 8:
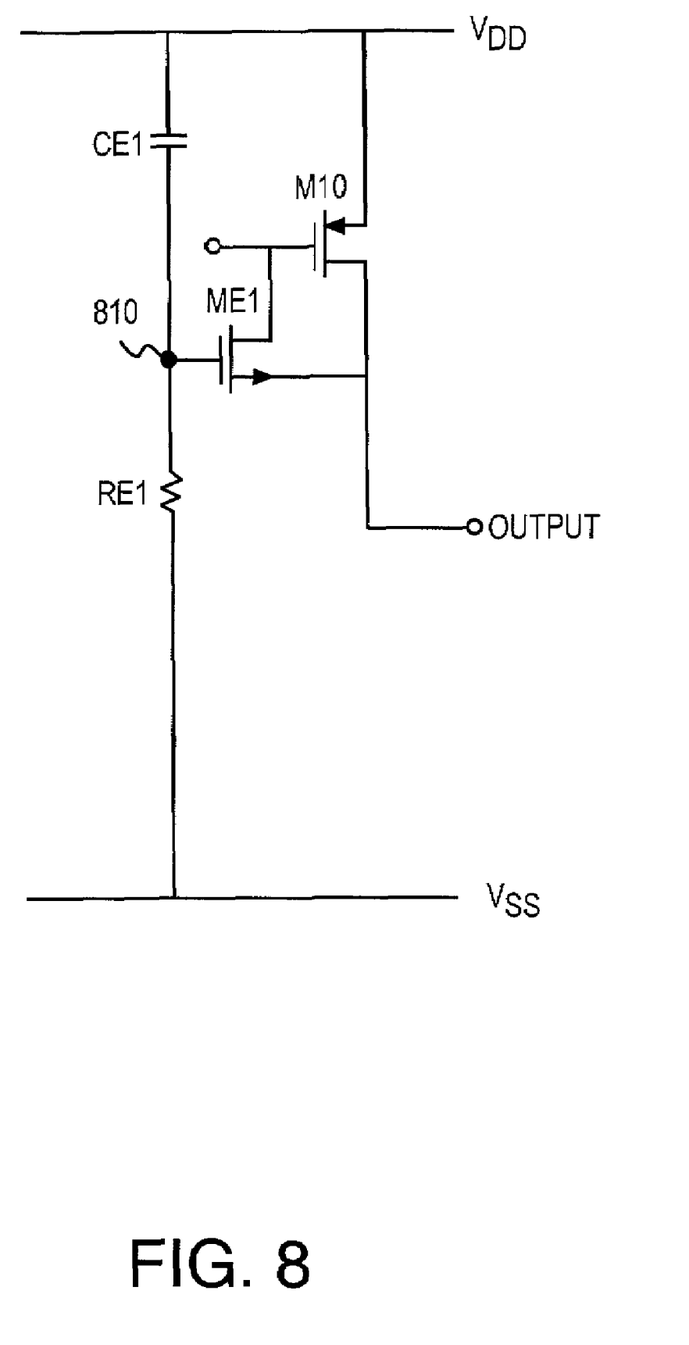
FIG. 8 illustrates an alternative embodiment of ESD protection circuitry.

FIG. 8 illustrates an improved ESD circuit for output transistor M10. The remainder of the circuitry for stage 3 is omitted so as not to obscure the ESD circuitry. Instead of a capacitor coupled directly to the output node, transistor ME1 couples the output node to the gate of M10. Resistor RE1 provides appropriate biasing during normal amplifier operation so that transistor ME1 is off.

Transistor ME1 effectively switches on when the output node rapidly falls, as in an ESD transient, below the $V_{DD}$ node, thus coupling the gate of M10 to the output node. The coupling of the $V_{DD}$ and output nodes substantially reduces any potential difference between the two.

The ESD circuit of FIG. 8 improves upon the ESD circuitry of FIG. 7 from the perspective of amplifier performance during normal operation because the output node is connected to the gate of the output device only when necessary (i.e., an ESD event) and there is no capacitor directly coupled to the output node. Transistor ME1 tends to becomes less effective as the potential difference between the $V_{DD}$ node and node 810 increases. The circuitry of FIG. 9 is designed to improve the effectiveness of transistor ME1 through the handling of the ESD event.

Figure 9:
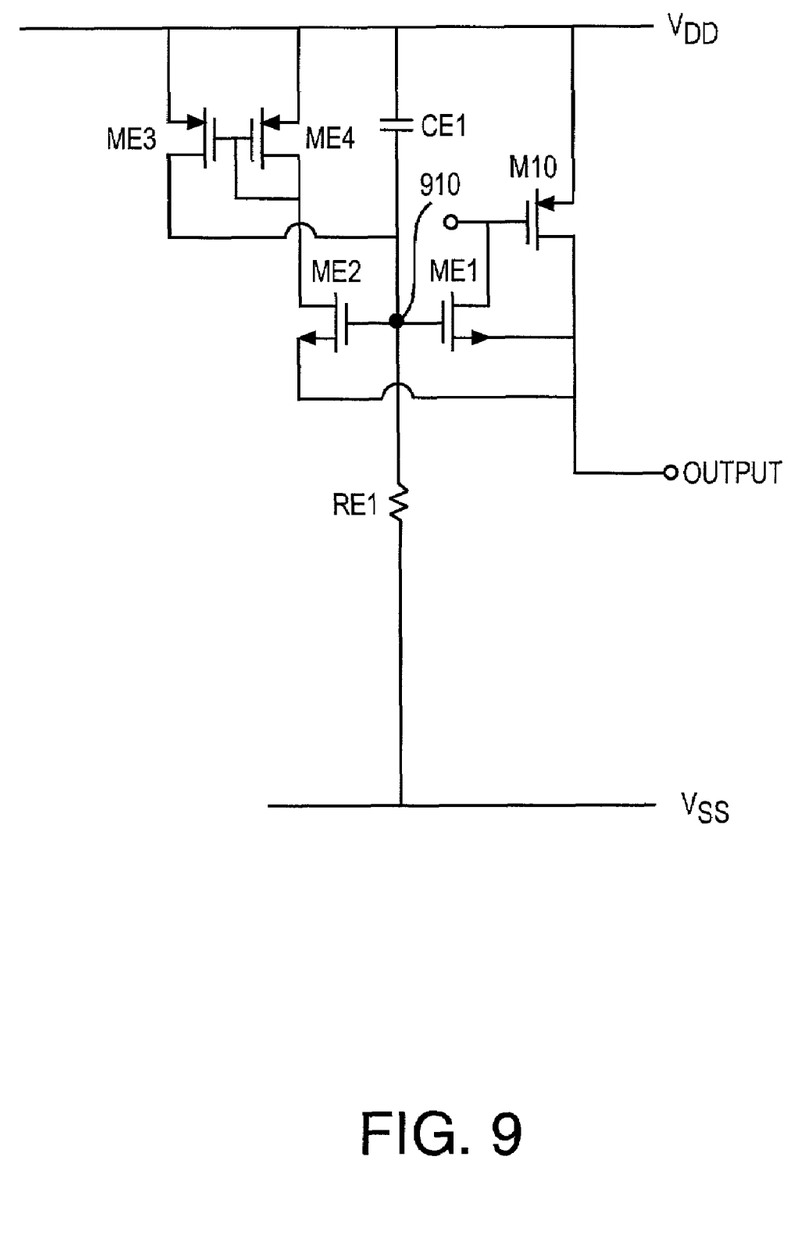
FIG. 9 illustrates another embodiment of ESD protection circuitry.

Referring to FIG. 9, ME2 turns on when ME1 turns on thus causing a drain current to flow through ME4. ME3 and ME4 form a current mirror so that ME3 mirrors the drain current flowing through ME4 (with a scaling factor dependent upon device geometry ratios) to provide $I_{ME3}$. The current $I_{ME3}$ is directed to node 910 which tends to hold the voltage at node 910 closer to $V_{DD}$ during the ESD event thus improving the effectiveness of ME1. The effectiveness of ME2-ME4 may be optimized by appropriate choice of current mirror ratios.

Although presented in examples with the above-referenced amplifier architecture, the ESD circuitry is not limited to this amplifier architecture or any specific amplifier architecture or application. Although particularly suited for this amplifier architecture, the disclosed ESD circuitry may be used in any other appropriate device for which comparable ESD protection is sought.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. An amplifier circuit apparatus, comprising:
    a) a first stage comprising a transconductance amplifier providing a pair of differential current outputs from a differential voltage input;
    b) a second stage comprising biasing and interface circuitry, the second stage providing a pair of differential current outputs in accordance with the first stage pair of differential current outputs; and
    c) a third stage comprising a pair of current amplifiers forming a class AB amplifier, each current amplifier having an output node, the output nodes forming a differential output signal line pair, wherein each current amplifier comprises a pair of complementary current mirrors providing a linear current gain of $N \geq 1$ for one of the second stage differential current outputs, wherein the second stage provides a voltage bias to control quiescent currents in the current mirrors.

2. The apparatus of claim 1 wherein each of the first, second, and third stages comprises metal oxide semiconductor field effect transistors (MOSFETs).

3. The apparatus of claim 1 wherein the apparatus further comprises:
 d) electrostatic discharge circuitry protecting at least one output device of one of the pair of current amplifiers.

4. The apparatus of claim 3 wherein the electrostatic discharge circuitry further comprises:
 a transistor coupled to short two terminals of the output device in response to an electrostatic discharge event;
 a resistor coupling a first node of the transistor to one power supply rail node; and
 a capacitor coupling the first node to a complementary power supply rail node.

5. The apparatus of claim 4 wherein the transistor is a metal oxide semiconductor field effect transistor (MOSFET).

6. The apparatus of claim 1 further comprising:
 feedback circuitry coupling the differential output signal line pair of the third stage to the differential input of the first stage to form a closed loop linear class AB amplifier.

7. The apparatus of claim 1 wherein the first stage comprises:
 a first plurality of current mirrors each providing a current I1; and
 a second plurality of current mirrors each providing a current I2, wherein a difference between I1 and I2 is proportional to an input voltage provided to the differential input of the first stage.

8. The apparatus of claim 7 wherein currents are selected from the first and second plurality of current mirrors to form a first differential output (I1, I2) and a second differential output (I2, I1) of the differential output pair.

9. The apparatus of claim 1 wherein the second stage comprises:
 voltage biasing circuitry to maintain a voltage bias between input nodes of each differential input of the third stage.

10. The apparatus of claim 1 wherein the second stage receives a control current $I_{AB}$, wherein the second stage controls quiescent currents of the third stage to be proportional to the control current $I_{AB}$.

11. The apparatus of claim 1 wherein at least two stages reside on a same integrated circuit die.

12. The apparatus of claim 1 wherein at least two stages reside within a same integrated circuit package.

13. The apparatus of claim 1 wherein N is substantially exclusively dependent only upon a ratio of a size of components of each current mirror.

14. An amplifier stage apparatus comprising:
 a pair of current amplifiers forming a class AB amplifier, each providing an associated output node of a differential output node pair, each current amplifier comprising:
 first and complementary second current mirrors coupled to receive a voltage bias and a differential input current from a corresponding same input node pair, wherein the voltage bias controls quiescent currents in the current mirrors, wherein the current mirrors provide an output current N times the corresponding differential input current to the associated output node, wherein $N \geq 1$.

15. The apparatus of claim 14 wherein N is substantially exclusively dependent only upon a ratio of a size of components of each current mirror.

16. The apparatus of claim 14 wherein the amplifier stage comprises metal oxide semiconductor field effect transistors (MOSFETs).

17. The apparatus of claim 14 wherein the amplifier stage resides on an integrated circuit die.

* * * * *